US005651017A

United States Patent [19]
Genovese

[11] Patent Number: 5,651,017
[45] Date of Patent: Jul. 22, 1997

[54] DRIVE CIRCUIT FOR HIGH-SPEED MODULATION OF A LASER DIODE

[75] Inventor: Frank C. Genovese, Fairport, N.Y.

[73] Assignee: Xerox Corporation, Stamford, Conn.

[21] Appl. No.: 426,501

[22] Filed: Apr. 21, 1995

[51] Int. Cl.$^6$ .................................................. H01S 3/00
[52] U.S. Cl. ................................................ 372/38; 372/26
[58] Field of Search ........................................ 372/26, 38

[56] References Cited

U.S. PATENT DOCUMENTS

| 4,685,097 | 8/1987 | van der Pat | 369/54 |
| 4,868,675 | 9/1989 | Joosten et al. | 372/38 |
| 5,061,949 | 10/1991 | Ogino et al. | 346/160 |
| 5,164,745 | 11/1992 | Matsuoka | 346/108 |

Primary Examiner—Rodney B. Bovernick
Assistant Examiner—Robert E. Wise
Attorney, Agent, or Firm—R. Hutter

[57] ABSTRACT

A drive circuit enables high-speed modulation of a laser diode. A transistor is associated with the laser diode. The transistor input is supplied with a constant bias current just below the lasing condition of the diode, and also to one or more switching currents which are shunted to the transistor input through Schottky diodes. This high-speed circuit can be used, for example, for modulating a writing beam in a "laser printer," or in a magnetic driver for a disk writer, or in fiber-optic communication.

5 Claims, 3 Drawing Sheets

DRIVE CIRCUIT FOR HIGH-SPEED MODULATION OF A LASER DIODE

The present invention relates to a drive circuit for high-speed modulation of a laser diode. More specifically, the invention relates to exciting a laser diode used to generate a writing beam in response to digital image data in an electrophotographic "laser" printer. This high-speed circuit can also be used for modulating a laser beam in a magnetic driver for a disk writer, or in fiber-optic communication.

Electrophotographic "laser" printers, wherein a laser scan line is projected onto a photoconductive surface to create an image to be printed, are well known. In the case of printers, facsimile machines, and the like, it is common to employ a raster output scanner (ROS) as a source of optical patterns to be imaged on photographic film or an electrostatically charged photoreceptor (a photosensitive plate, belt, or drum) for purposes of printing. The ROS provides a laser beam which switches on and off according to electronic image data associated with the desired image to be printed, exposing the charged photoreceptor point by point as the beam moves, or scans, across its surface. Commonly, the surface of the photoreceptor is selectively imagewise discharged by the laser beam in locations to be printed white, to form the desired image on the photoreceptor. Modulation of the scanned beam creating the desired latent image on the photoreceptor is typically implemented by digital circuitry designed to control the level of operating current that defines the light flux output of a high speed laser diode. A common technique for deflecting the modulated laser beam to form a scanline across the photoreceptor surface uses a motor driven rotating optical polygon with multiple reflecting surfaces; the laser beam from the collimated laser diode source is reflected by the facets of the polygon, creating a scanning motion of the beam, which is optically imaged to form a sharply focused scan line across the photoreceptor. A closely spaced regular array of scan lines on a photoreceptor collectively form a raster of the desired latent image. Once a latent image is formed on the photoreceptor, the latent image is subsequently developed with toner, and the developed image is transferred to a copy sheet, as in the well-known process of electrophotography.

In a practical ROS system, an important parameter is the operating intensity of the laser writing beam which discharges the selected areas on the photoreceptor. As is well-known in the art of laser diodes, a typical laser diode has associated therewith a "lasing threshold current" of a predetermined magnitude, which, when applied to the laser diode, causes the laser diode to emit a coherent laser beam. Below this lasing excitation threshold, the laser diode emits light flux, but the light emitted is incoherent. Above the lasing threshold, there is a well defined response curve relating applied current and the intensity of light flux emitted by the laser diode.

Given the excitation response of a commercially-available laser diode, it has been found that modulation speed (that is, the time required to turn the laser on and off in response to digital data) can be improved by biasing the diode at an operating point just below the lasing threshold. To discharge picture elements (pixels) on the photoreceptor, the operating current is increased from the bias or standby condition to the desired lasing level at the appropriate time. By biassing the laser diode at an operating point just below the lasing threshold, the voltage swing needed to make transitions between the standby and lasing conditions is minimized. The speed improvement is partly the result of the reduced charges that must be supplied to parasitic circuit capacitances during the transitions between the on and off states. Typically, the modulation current is supplied by a PNP transistor, which is operated in a grounded base or grounded emitter configuration according to an input digital data stream. In prior-art systems, a fast switching transistor is used to supply the lasing current which is added to a constant bias current supplied to the laser diode at the node between the switching transistor and the laser diode. One practical problem with this arrangement is that the inherent delay and storage times of the switching transistor become a constraint on the maximum modulation speed of the entire system; the maximum modulation frequency depends on how fast the transistor can be switched between the on and off states in response to digital video data applied to the input node.

U.S. Pat. No. 5,164,745 discloses a laser printer wherein a laser beam is detected by a photosensor, presetting a flip-flop. A timer is driven in accordance with a preset output from the flip-flop, driving the laser to emit a laser beam. A second timer is driven in response to a front edge of the preset output of the flip-flop to generate a horizontal synchronizing signal.

U.S. Pat. No. 5,061,949 discloses, in FIG. 4 thereof, a triggering and feedback system for a laser diode in a laser printer. As can be seen, a bias voltage is applied to the laser diode at a point downstream of a switch SW3 which is used to selectably activate the laser diode. Further downstream of the switch SW3 is a feedback system by which light detected from the laser diode is adjusted in intensity.

U.S. Pat. No. 4,868,675 discloses a control circuit for a laser printer which utilizes a laser switching amplifier for supplying current to a laser diode. The control circuit has a correction circuit which compensates for the turn-on delay time of the laser diode. The correction circuit lengthens the incoming image signal which controls the laser diode by a correction time.

U.S. Pat. No. 4,685,097 discloses an exposure control system for a laser printer, in which a light sensing diode is used to determine laser output power, which is then used to operate the control circuit by adjusting read and write currents supplied to the laser.

According to the present invention, there is provided a drive circuit for applying current to a laser diode to cause the laser diode to output a modulated laser beam. A drive switch is provided, having an output connected to the laser diode, an input, and a base. The base causes a connection between the input and output when activated. A ground switch, having an output connected to ground, an input, and a base, is also provided, the base causing a connection between the input and output when activated. A bias source is commonly connected to the input of the drive switch and the input of the ground switch. The bias source provides a voltage less than a lasing voltage of the laser diode. A switching source, commonly connected to the input of the drive switch and the input of the ground switch, provides a voltage greater than a lasing voltage of the laser diode when combined with the voltage of the bias source. A video selector selectably activates one of the base of the drive switch and the base of the ground switch.

Figure 3:
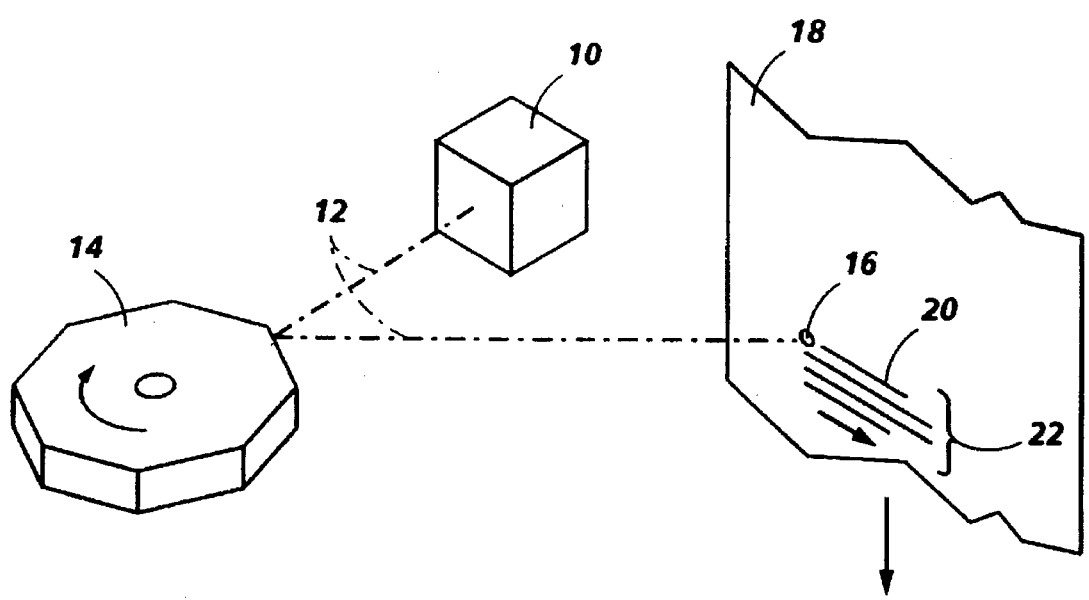
FIG. 3 is a perspective view of the basic elements of a raster output scanner that would use a drive circuit according to the present invention.

FIG. 3 shows the basic configuration of a scanning system used, for example, in an electrophotographic printer or facsimile machine. A laser source 10 produces a collimated laser beam, also referred to as a "writing beam," 12 which is reflected by the facets of a rotating polygon 14. Each facet of the polygon 14 in turn deflects the writing beam 12 to create an illuminated spot 16 on the pre-charged surface of photoreceptor 18, which in this case is a moving belt. Laser source 10 also includes means for modulating the beam 12 according to image data entered therein. The localized light flux in spot 16 incident at a particular location on the surface of photoreceptor 18, corresponding to a picture element (pixel) in the desired image, discharges the surface for pixels of the desired image which are to be printed white. In locations having pixels which are to be printed black, writing beam 12 is momentarily interrupted through the action of the modulator within source 10, so that the pixel at that location on the surface of photoreceptor 18 will not be discharged. It is to be understood that gray levels are typically imaged in like manner by utilizing exposure levels intermediate between the "on" and "off" levels. Thus, digital data input into laser source 10 is rendered line by line as an electrostatic latent image on the photoreceptor 18.

The rotational motion of polygon 14 results in a spot 16 moving across photoreceptor 18 to form a scan line 20 of selectively discharged areas on photoreceptor 18. At the same time, the surface of photoreceptor 18 is slowly translated at a constant velocity so that the periodic scanning of spot 16 across the moving photoreceptor 18 creates an evenly spaced closely spaced array of scan lines 20, called a raster 22, on the photoreceptor 18, forming the desired continuous image to be printed. One skilled in the art will appreciate that such a configuration has traditionally further included any number of lenses, mirrors and translational mechanisms to accommodate a specific design.

Figure 1:
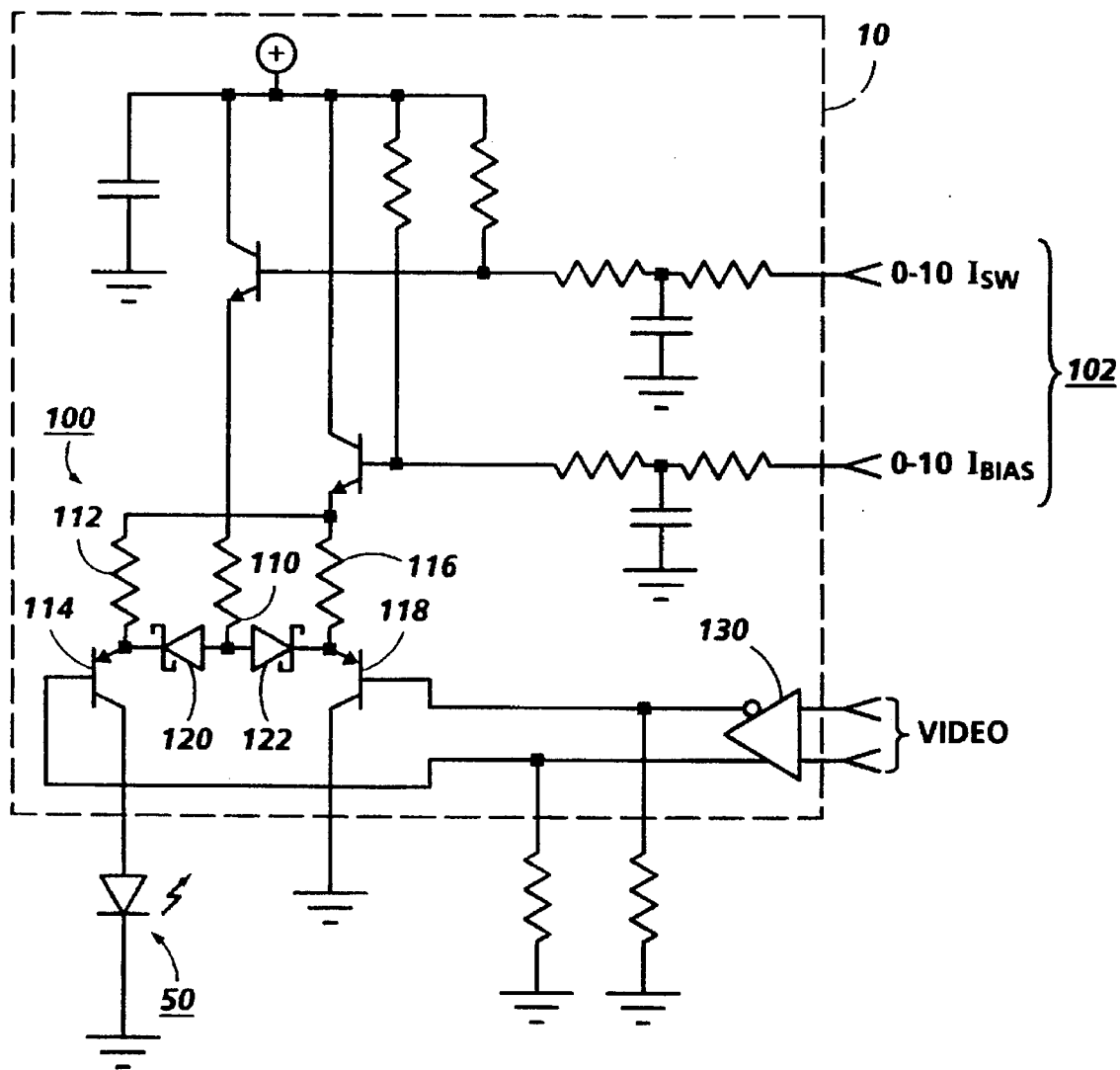
FIG. 1 is a schematic diagram of one embodiment of a drive circuit according to the present invention.

FIG. 1 is a schematic diagram showing the drive circuit according to the present invention. The drive circuit generally indicated as 100 is adapted to drive a laser diode indicated as 50, all of which forms at least part of laser source 10. The portion of the drive circuit in the top portion of the schematic, generally indicated as 102, represents a basic supply circuit for developing the desirable bias and lasing currents from an external power supply. Although the configuration shown is preferred for one known embodiment of the drive circuit, it will be apparent that other configurations of current sources in circuit 102 are possible.

The two operational variables of circuit 102 are a switching current $I_{SW}$, which is typically on the order of 20 to 35 ma, and the bias current $I_{BIAS}$, which is typically about 50 ma. $I_{SW}$ is developed by the potential drop across the 140Ω resistor 110, while $I_{BIAS}$ for transistors 114 and 118 is developed by the potential drop across 100Ω resistors 112 and 116. As shown in the Figure, both $I_{SW}$ and $I_{BIAS}$ flow to a common point at the inputs of transistor 114 and 118, respectively. In the preferred embodiment of the invention the transistors 114, 118, which directing the current flow, are PNP transistors operating in the grounded base configuration, and currents $I_{SW}$ and $I_{BIAS}$ are summed at the emitters thereof, as shown.

Further, the switched current $I_{SW}$ can flow to the emitter of each transistor through a Schottky diode 120 and 122, respectively. As is known in the art, a Schottky diode consists of a junction in which majority carriers carry the current flow. When the diode is forward-biased, the carriers are injected into the metal side of the junction and remain "hot" with respect to the metal lattice. Consequently, such diodes can be switched at extremely high rates with a relatively small difference in forward bias potential.

As can further be seen in FIG. 1, the bases of transistors 114 and 118 are connected to the inverting and non-inverting outputs of gate 130, which establishes the base potential of each transistor at one of the two complementary gate output operating voltages. When gate 130 is in one of its two possible stable states, the base of transistor 114 is at a slightly higher potential than the base of transistor 118, and when gate 130 is in its other stable state, the base of transistor 118 is at a slightly higher potential than the base of transistor 114. Thus, in toggling between its two normal operating states, gate 130 raises the potential of one transistor base with respect to the other. Since both transistors are operating in the grounded base configuration and are not in the cutoff condition, the emitter of one of the transistors is correspondingly raised in potential with respect to the emitter of the other transistor.

Current $I_{SW}$ from resistor 110 reaching the node between Shottky diodes 120 and 122 flows preferentially to the emitter of the transistor at the lowest potential. The output voltage swing of an emitter coupled gate such as gate 130 is typically larger than the differential forward voltage drop of Shottky diodes operated between cutoff and $I_{SW}$ levels on the order of 20 to 35 ma. As a consequence, the entire current $I_{SW}$ flows through the Shottky diode connected to the emitter at the lower potential, is summed with the bias current $I_{BIAS}$ flowing to that emitter, and is delivered by the transistor's collector. The collector of transistor 114, as shown, delivers current to the laser diode 50, while the collector of transistor 118 is not used and is made to flow directly to ground. Thus bias current flows at all times through both transistor 114 and transistor 118, with the additional switching current being shunted to one or the other collector depending on the state of gate 130. When $I_{SW}$ is shunted to the emitter of transistor 114, it flows through laser diode 50 which is thereby excited to lase at the desired power level and discharge a pixel area on a photoreceptor. Conversely, when $I_{SW}$ is shunted to the emitter of transistor 118 it flows directly to ground and only the bias current $I_{BIAS}$ is delivered to the laser diode which is then operating below its lasing threshold. The video selector, as recited in the claims, which functions to selectably activate one of the base of a drive switch (in the illustrated embodiment, transistor 114) and the base of a ground switch (transistor 118), may also be embodied by other electronic devices having a suitable output, such as, for example, a flip-flop with complementary outputs, or a microprocessor.

Viewing transistors 114 or 118 as current switches, it is evident that essentially constant values of $I_{SW}$ and $I_{BIAS}$ are applied to the inputs of each current switch, and the $I_{SW}$ current is selectably shunted to one of the two summation nodes through a fast-response Schottky diode. The practical significance of this arrangement is that transistors 114 or 118 are never biased off at any time. Each transistor toggles between two highly conductive states instead of between a conduction and a cutoff condition. Thus the emitter, base, and collector of transistors 114 and 118 are always being operated at low impedance. By supplying both the bias and lasing current to laser diode 50 through one transistor collector instead of summing the collectors of separate bias and lasing current sources at the laser diode input, the parasitic capacitive load at the laser diode input is reduced, improving the overall system speed. The transient response of transistors 114 and 118 for transitions between the two logical gate output states is that of emitter followers, which are generally faster than transistor switches which make transitions between a conducting state and a condition where collector current is shut completely off, Further, the circuitry needed to establish the bias and lasing current levels is simple since high output impedance current sources are not required. In the preferred embodiment of FIG. 1, resistors 105 and 107 provide low impedance loads to emitter follower transistors 104 and 106 respectively so that resistors 110, 112, and 116 are effectively driven by low impedance voltage sources. Alternatively, currents $I_{BIAS}$ and $I_{SW}$ can also be provided by current sources in the form of collector circuits that exhibit high voltage compliance and high output impedance. However, these circuits generally have longer transient time constants than the preferred arrangement of FIG. 1 because of the parasitic collector capacitance in parallel with the relatively high output circuit impedance.

Although the static currents supplied in the preferred embodiment are uncompensated for changes in temperature which affect transistor base characteristics, it will be understood by those practicing the art that because the light output of laser diodes is itself a strong function of temperature, typical laser drive circuits are operated in a feedback loop whereby a light intensity sensing system operating in conjunction with the laser diode drive circuitry is used to monitor and continually adjust the mean laser beam power. As the drive circuit 100 is modulated in response to digital data, the current switching function is actually performed by hot carrier Schottky diodes, which are much faster than most transistor switches and have relatively small forward bias characteristics. For the circuit shown in FIG. 1, using 10K ECL Logic 2N3904S, and the illustrated values of $I_{BIAS}$ and $I_{SW}$, switching times have been shown to be significantly less than 2 nanoseconds under typical operating conditions.

Another variation of the drive circuit of the claimed invention is to provide a laser drive circuit which can selectably supply several discrete current levels as needed to a laser diode 50. Such an arrangement may be useful for a "tri-level" laser printing system, in which the laser diode 50 used to create a latent image is operated at distinct lower and higher power lasing levels according to the requirements for generating the desired tri-level image. In order to provide two well defined lasing levels from a single laser diode 50, it is typically necessary to be able to selectably apply two distinct operating currents, both of course being above the lasing threshold of laser diode 50.

Figure 2:
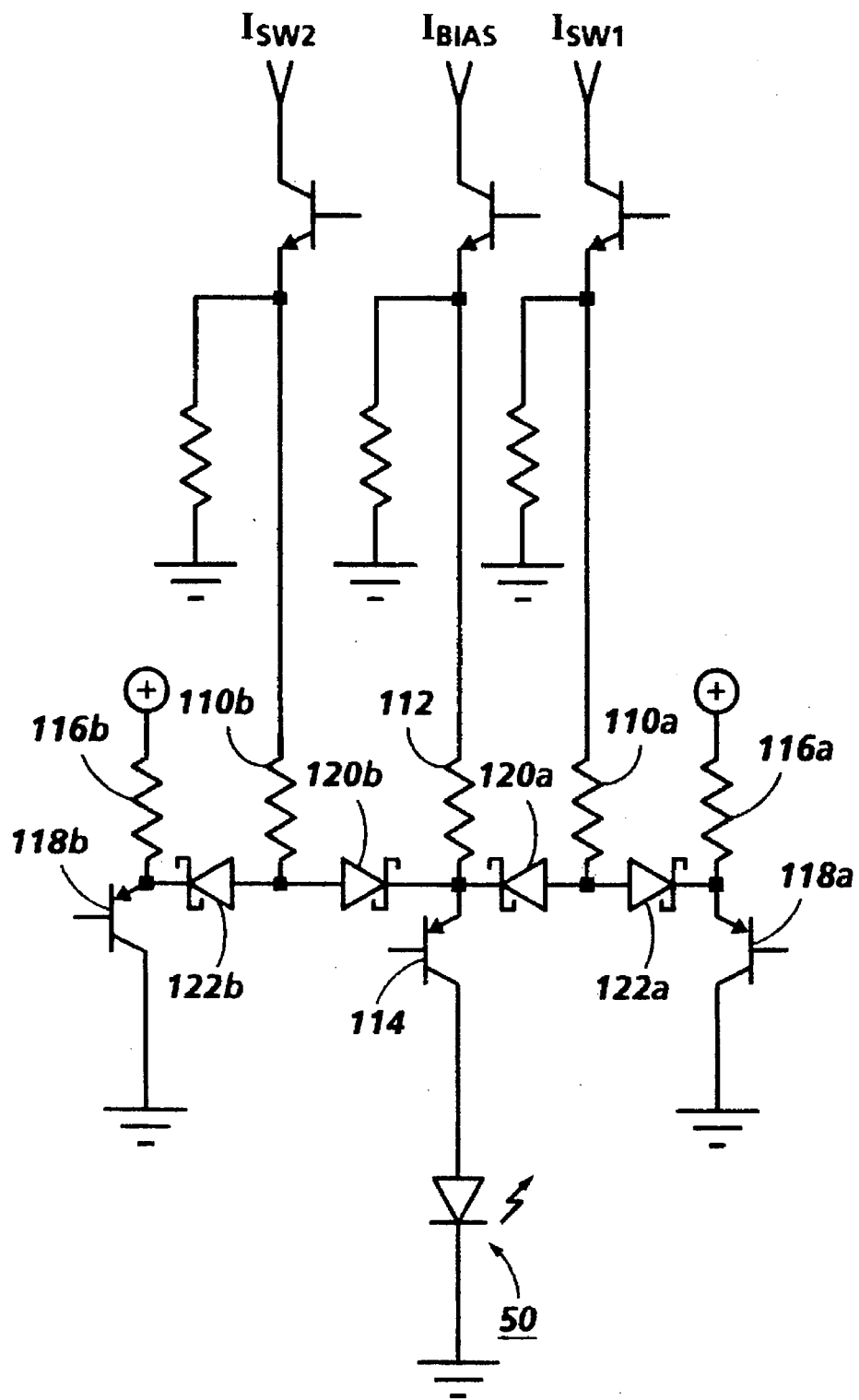
FIG. 2 is a schematic diagram of another embodiment of a drive circuit according to the present invention.

FIG. 2 shows the relevant portions of a drive circuit according to the present invention, suitable for such tri-level control of the laser diode 50. In FIG. 2, like reference numerals indicate like elements as in FIG. 1. As can be seen in the Figure, a bias current $I_{BIAS}$ is supplied by resistor 112 directly to the emitter of transistor 114, and a first switching current $I_{SW1}$ may be selectably applied to the emitter of transistor 114 through Schottky diode 120a as needed. When the base potential of transistor 118a is lowered so that switching current $I_{SW1}$ does not flow through Schottky diode 120a to laser diode 50, the switching current $I_{SW1}$ is instead shunted to ground through Schottky diode 122a and transistor 118a. In addition to these elements which are included in the FIG. 1 embodiment, there is also provided means for providing a second switching current $I_{SW2}$ established by means of resistor 110b which may be selectably applied to the emitter of transistor 114 through a second Schottky diode 120b. The second switching current $I_{SW2}$ is applied to the same circuit node as is $I_{BIAS}$ and $I_{SW1}$ and adds to the existing current at the emitter input of transistor 114. As in the case of $I_{SW1}$, when the base potential of transistor 118b is established so that switching current $I_{SW2}$ does not flow through Schottky diode 120b to laser diode 50, it is instead shunted to ground through Schottky diode 122b and transistor 118b.

In this manner, a control system operating the drive transistor 114 and respective ground transistors 118a and 118b can be used to apply an arbitrary bias current $I_{BIAS}$ and two separate currents, $I_{SW1}$ and $I_{SW2}$ to excite laser diode 50 in order to discharge the photoreceptor to one of two predetermined charge levels at each pixel. The switching currents $I_{SW1}$ or $I_{SW2}$ may be equal or unequal,and may be operated independently such that the first of the two switching currents excites the lower power lasing condition of laser diode 50, and the second switching current excites the higher power lasing condition of laser diode 50. Alternatively one switching current can be applied to excite the lower power lasing condition of laser diode 50 to which the second switching current is combined to excite the higher power lasing condition of laser diode 50, as required.

Referring to the circuit configurations in both FIG. 1 and FIG. 2, it will be understood by those familiar with the electronic art that the addition of currents at the input node of transistor 114 operating in the grounded-base configuration is essentially linear, providing the transistor is constrained to operate within an envelope of relatively high collector current gain. However, because the emitter-to-base forward voltage drop of transistor 114 changes slightly as a function of the net emitter current, the individual currents delivered by resistors 110 and 112 to the emitter node are not totally independent of each other. Since this interaction is on the order of only 1 or 2 percent, it is easily compensated by adjusting the current control inputs of circuit 102. A laser control system using the present invention in combination with a feedback loop to monitor and continually adjust the two mean laser beam power levels would automatically compensate for the current interaction as well.

In the above embodiments, the advantage of incorporating Schottky diode 122 for the current paths to ground is that by providing circuit symmetry, the interface with standard logic input is simplified, and the symmetric design provides superior differential temperature compensation. However, in applications where these considerations are not of importance, the additional Schottky diodes generally denoted as 122 in FIGS. 1 and 2 providing current paths to ground via transistors 118 may be omitted with no loss in dynamic circuit performance.

Although the invention has been described with particular application to creation of a writing beam in a raster-output scanner for an electrophotographic printer, the basic principle of high-speed modulation of a laser diode may further be applied to any number of contexts, such as writing of magentic disks, or fiber-optic communication.

While the invention has been described with reference to the structure disclosed, it is not confined to the details set forth, but is intended to cover such modifications or changes as may come within the scope of the following claims.

I claim:

1. A drive circuit for applying voltage to a laser diode to cause the laser diode to output a modulated laser beam, comprising:

a drive switch, having an output connected to the laser diode, an input, and a base, the base causing a connection between the input and output when activated;

a ground switch, having an output connected to ground, an input, and a base, the base causing a connection between the input and output when activated;

a bias source, commonly connected to the input of the drive switch and the input of the ground switch, the bias source being of a voltage less than a lasing voltage of the laser diode;

a switching source, commonly connected to the input of the drive switch and the input of the ground switch, the switching source being of a voltage greater than a lasing voltage of the laser diode when combined with the voltage of the bias source; and a video selector, adapted to selectably activate one of the base of the drive switch and the base of the ground switch.

2. The drive circuit of claim 1, further comprising a Schottky diode disposed between the switching source and the input of the drive switch.

3. The drive circuit of claim 1, further comprising a Schottky diode disposed between the switching source and the input of the ground switch.

4. The drive circuit of claim 1, the drive switch comprising a PNP transistor, the input being an emitter of the PNP transistor.

5. The drive circuit of claim 1, further comprising a second ground switch, having an output connected to ground, an input, and a base, the base causing a connection between the input and output when activated;

a second switching source, commonly connected to the input of the drive switch and the input of the second ground switch, the second switching source being of a voltage greater than a lasing voltage of the laser diode when combined with the voltage of the bias source, and the video selector being further adapted to activate the second ground switch.

* * * * *